(12) United States Patent
Nakao et al.

(10) Patent No.: US 7,554,040 B2
(45) Date of Patent: Jun. 30, 2009

(54) PRINTED CIRCUIT BOARD AND SOLDERING METHOD AND APPARATUS

(75) Inventors: Yoshitada Nakao, Kosai (JP); Masateru Tsutsumi, Kosai (JP); Takayuki Fujikawa, Kosai (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 0 days.

(21) Appl. No.: 11/460,943

(22) Filed: Jul. 28, 2006

(65) Prior Publication Data

US 2007/0029108 A1  Feb. 8, 2007

(30) Foreign Application Priority Data

Aug. 5, 2005  (JP) ............................ 2005-227876

(51) Int. Cl.
*H05K 1/16* (2006.01)
(52) U.S. Cl. ..................................... 174/260; 174/261
(58) Field of Classification Search ............... 174/260, 174/261
See application file for complete search history.

(56) References Cited

U.S. PATENT DOCUMENTS

| 5,451,720 | A  | * | 9/1995  | Estes et al. ................... 174/250 |
| 5,730,932 | A  | * | 3/1998  | Sarkhel et al. .............. 420/562 |
| 6,617,529 | B2 | * | 9/2003  | Ishizuka et al. ............. 174/266 |
| 6,657,135 | B2 | * | 12/2003 | Suetsugu et al. ............ 174/262 |
| 2004/0108130 | A1 | * | 6/2004 | Suzuki et al. ................ 174/252 |

FOREIGN PATENT DOCUMENTS

| JP | H05-72176   | * | 3/1991 |
| JP | 9-148691 A  |   | 6/1997 |
| JP | 103222025   | * | 12/1998 |

\* cited by examiner

*Primary Examiner*—Ishwar (I. B.) Patel
(74) *Attorney, Agent, or Firm*—Workman Nydegger

(57) ABSTRACT

A printed circuit board suitable for dip soldering of component leads in through holes using lead free solder. The printed circuit board includes a plurality of via holes arranged around each through hole in which a component lead is inserted, whereby solder wicking up into the through hole is enhanced and air entrapment is prevented during the dip soldering operation, and heat fatigue resistance of solder joints is improved.

6 Claims, 4 Drawing Sheets

PRINTED CIRCUIT BOARD AND SOLDERING METHOD AND APPARATUS

The present disclosure relates to subject matter contained in priority Japanese Patent Application No. 2005-227876, filed on Aug. 5, 2005, the contents of which is herein expressly incorporated by reference in its entirety.

BACKGROUND OF THE INVENTION

1. Field of the Invention

The present invention relates to a printed circuit board suitable for dip soldering of component leads in through holes of the printed circuit board using lead free solder, and a method and apparatus for dip soldering.

2. Description of the Related Art

Dip soldering that uses Sn—Pb eutectic solder is a common method of soldering component leads in through holes of printed circuit boards. A power supply terminal pattern or ground pattern on the surface of a printed circuit board consisting of copper foil 31 usually stretches over a wide area in a continuous manner as shown in FIG. 6A and FIG. 6B. A through hole 33 with a copper foil 34 on its inner surface is provided in a portion where a component lead 32 is connected, so that the lead will be inserted in the through hole and soldered to connect an electronic component thereto. The copper foil 31 on the surface includes an annular portion 35 around the through hole 33 with a predetermined width, a plurality of circular arc slits 37 with a predetermined width connected by a plurality of circumferentially spaced connection parts 36 around the annular portion. This is called a thermal land 38, and provided for quickly conducting the heat of molten solder that has flowed into the through hole 33 to the copper foil 31 on the surface to quickly cool down the solder so that it does not reach up to the upper surface of the through hole 33; it is intended to ensure formation of a favorable fillet between the periphery of the lead 32 and the copper foil 31 on the surface. Heat is conducted to the annular portion 35 around the through hole 33, which further assists the formation of the fillet.

In a known printed circuit board technique shown, for example, in Japanese Patent Publication No. 9-148691, planar patterns of copper foil are formed on the upper and lower surfaces of a portion where a heat generating element is mounted, separately from a circuit pattern for connecting the connection terminal of the heat generating element. Six or more via holes with copper-plated inner walls are drilled through the upper and lower surfaces of this portion in a dense arrangement for the purpose of heat conduction. Both ends of the via holes are respectively connected to the upper and lower copper foil planar patterns, so that heat from the heat generating element is efficiently dissipated from the upper and lower planar patterns.

Meanwhile, lead free solder has been increasingly used in soldering operations of printed circuit boards so as to avoid adverse effects of heavy metal such as lead on the environment. However, dip soldering operations using lead free solder with the printed circuit board design shown in FIG. 6A and FIG. 6B entail various problems, such as insufficient solder wicking up into the through holes and the consequent difficulty of forming fillets, air entrapment in solder, and short heat fatigue life of solder joints.

The technique disclosed in Japanese Patent Publication No. 9-148691 only shows a design which combines the upper and lower copper foil planar patterns with a large number of via holes with copper-plated inner walls for the purpose of dissipating heat from the heat generating element and does not teach direct solutions to such problems.

SUMMARY OF THE INVENTION

An object of the invention is to solve these problems encountered by the conventional techniques and to provide a printed circuit board and a method and apparatus for dip soldering leads in through holes using lead free solder, with which solder wicking is enhanced, air entrapment is prevented, and heat fatigue resistance of solder joints is improved.

Through intensive research, the inventors of the present invention have found out the causes and possible solutions of the above described problems that arise in dip soldering operations using lead free solder: With lead free solder, there tends to be a difference in temperature between the upper and lower parts of solder inside the through hole. A temperature drop in the upper part reduces the solder wettability and inhibits solder wicking up into the through hole. The reduced temperature also causes a decrease in solder flowability, which leads to air entrapment. Furthermore, the temperature difference between the upper and lower parts of solder inside the through hole, particularly the temperature drop in the upper part, is actually caused by the heat dissipation from the "thermal land" on the surface of the printed circuit board around the through hole. Accordingly, the present invention provides solutions to these problems by heating the through hole from around using the heat of molten solder. That is, to achieve the above object, the present invention provides a printed circuit board including a through hole, in which a lead is inserted and dip soldered using lead free solder, and a plurality of via holes around the through hole.

With this configuration, during the dip soldering, the through hole is efficiently heated from the surrounding area as molten solder flows into the via holes around the through hole. Therefore, the temperature difference in solder that has flowed into the through hole is kept small, and the temperature in the upper part of the solder is kept high. The high temperature in the upper part of the solder enhances solder wicking into the through hole, and a favorable fillet is formed between the periphery of the lead and the surface metal foil. The high temperature of the solder also ensures high flowability, whereby no air remains entrapped in the solder, and as a result, the heat fatigue resistance of solder joints is improved.

These via holes are all located within the range of a radius that substantially corresponds to the moving distance of the printed circuit board in one second from the center of the through hole during the dip soldering operation, and the metal foil on the back surface and a metal foil of a given layer apart from that on the front surface are connected to each other. This way, the through hole is efficiently heated from around, and the above-described effects are reliably achieved.

Further, $D1=d+(0.2~2.0)$mm may be realized where $D1$ is the outside diameter of the metal foil on the surface around the through hole and d is the inside diameter of the through hole. Alternatively, a resist may be covered on the metal foil on the surface, in which case $D2=d+(0.2~2.0)$mm may be realized where $D2$ is a diameter of an uncovered portion of the resist around the through hole and d is the inside diameter of the through hole. This way, because the area where the metal foil is exposed around the through hole on the surface of the printed circuit board is small, heat dissipation from around the through hole on the board surface is restricted. Therefore, the temperature of the solder that has flowed into the through hole is kept high, and the above-described effects are reliably achieved.

An additional via hole may be provided on the side opposite from the moving direction of the printed circuit board during the dip soldering operation, so that the through hole is heated for a longer period of time during the transfer of the board, and the above described effects are reliably achieved.

Another via hole may be provided for connecting the surface of the printed circuit board and a metal foil of a given layer apart from the surface on the outer side of the region where the insulating resin plate is exposed and the above described via holes are provided around the through hole. Such connection between the surface pattern and another layer compensates for any decrease in the EMC effect caused by the lack of direct connection between the metal foil on the surface and the through hole.

The present invention also provides a method of soldering a printed circuit board, for dip soldering a component lead in a through hole of a printed circuit board using lead free solder, comprising: inserting the component lead in the through hole of the printed circuit board that includes a plurality of via holes around the through hole; and moving the printed circuit board at a predetermined speed above a dipping section where molten solder is ejected upwards. With this method, the temperature of solder in the through hole is kept high, and the above-described effects are reliably achieved.

The via holes are all located within the range of a radius that corresponds to the moving distance of the printed circuit board in one second from the center of the through hole, so that the through hole is efficiently heated from around and that the above described effects are reliably achieved.

The surface of the printed circuit board should preferably be heated from above in the dipping section or in its vicinity, so that heat dissipation from the board surface is restricted and that the above described effects are reliably achieved.

Preferably, a shield cover should be provided above the printed circuit board to protect the main part of the electronic component from heat, so that, while preventing thermal damage to the electronic component, the intended effects of heating from above are achieved.

A dip soldering apparatus for a printed circuit board according to the present invention includes a dipping section where molten solder is ejected upwards and above which the printed circuit board is moved along a predetermined transfer path for the dip soldering operation, and heating means arranged above the transfer path for radiating heat energy towards the dipping section or its vicinity. With this apparatus, heat dissipation from the board surface is restricted as described above, and the above-described effects are reliably achieved.

The apparatus includes a partial dipping jig for holding and moving the printed circuit board along the transfer path such that part of the printed circuit board that is to be dip soldered is exposed on the underside. Preferably, this partial dipping jig should include a shield cover for shielding the main part of the electronic component mounted on the printed circuit board from radiation heat from the heating means so as to prevent other parts of the board from heat and to prevent thermal damage to the electronic component while achieving the effects of heating the dip soldered part from above.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

Preferred embodiments of the printed circuit board and its soldering method and apparatus of the present invention will be hereinafter described with reference to FIG. 1A to FIG. 5. It should be noted that the embodiments shown below are merely examples of embodiment of the present invention, and by no means intended to limit the technical scope of the invention.

First Embodiment

Figure 1A:
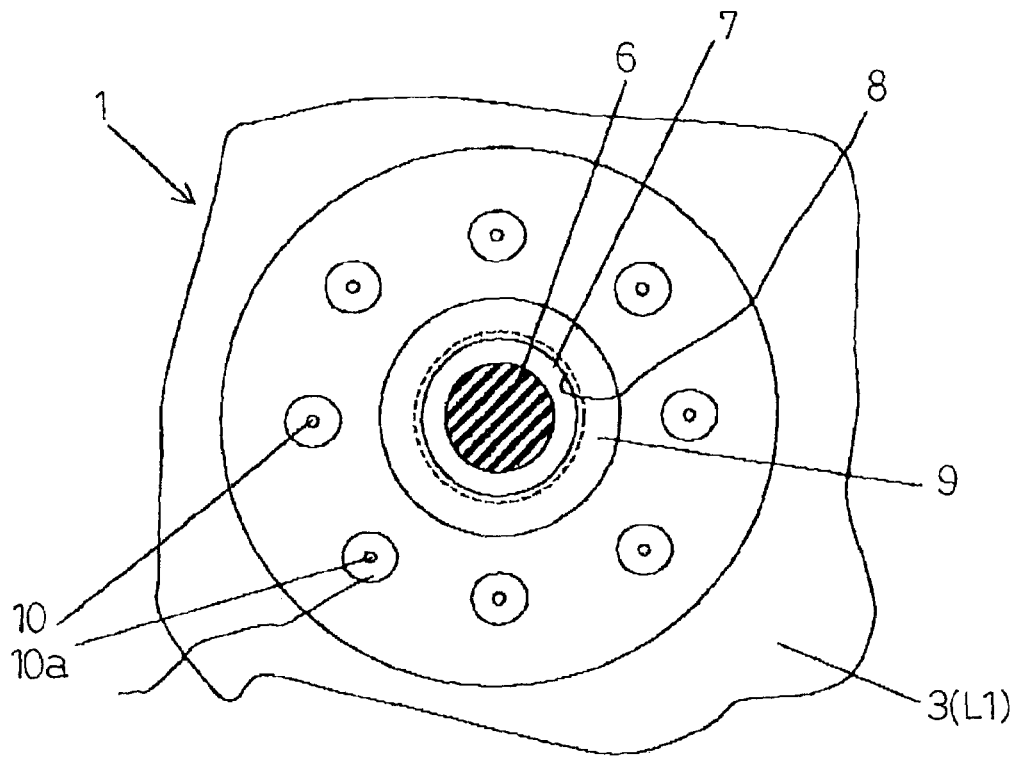
FIG. 1A and FIG. 1B show a relevant part of a printed circuit board according to a first embodiment of the present invention, FIG. 1A being a detailed plan view and FIG. 1B being a detailed longitudinal cross-sectional view.
Figure 1B:
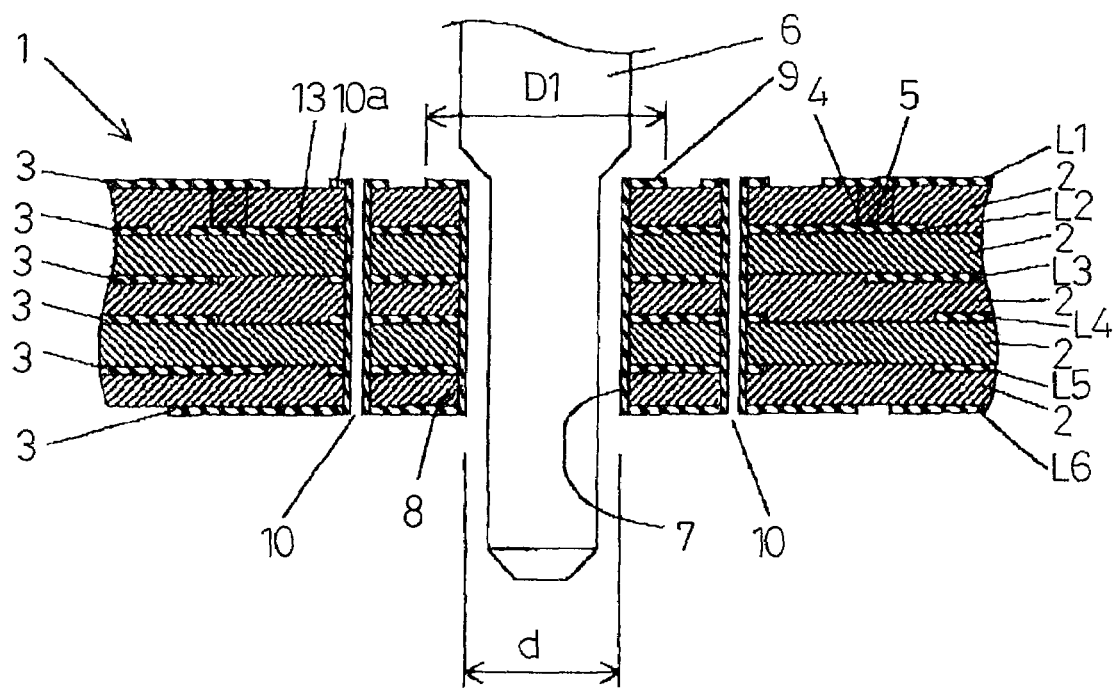
Figure 2:
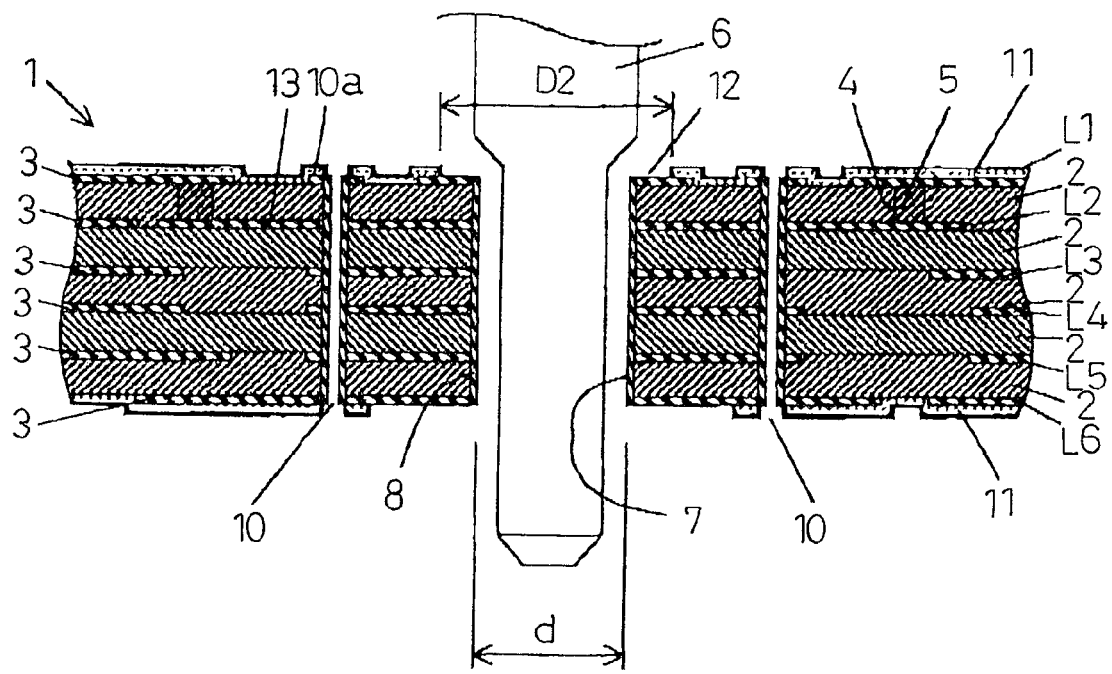
FIG. 2 is a detailed longitudinal cross-sectional view showing a relevant part of a modified example of the same embodiment.

A first embodiment will be described with reference to FIG. 1A, FIG. 1B, and FIG. 2. FIG. 1A and FIG. 1B show a multilayer printed circuit board 1 made up of five laminated insulating resin plates 2 such as glass epoxy resin. Six layers of metal foil patterns 3 such as copper foil patterns are formed as required on the front and back surfaces and in between the resin plates, denoted at L1 to L6 from the front side. These patterns 3 are connected to each other through conductive material 5 filled in holes 4 drilled in any of the insulating resin plates 2 so as to construct a three-dimensional, high-density wiring pattern.

The printed circuit board 1 includes a through hole 7 extending from the front surface to the back surface at an appropriate location of a power supply terminal pattern or ground pattern that stretches continuously over a wide area in the front metal foil pattern 3 (L1). A lead 6 of an electronic component is inserted through the hole 7 and soldered. A tubular metal foil 8 is provided on the inner surface of the through hole 7. At the top end of the tubular metal foil 8, i.e., around the through hole 7 in the metal foil pattern 3 (L1) on the front surface of the board 1 is formed an annular metal foil 9 integrally with the tubular metal foil 8 with a width that is just large enough to form a fillet between itself and the lead 6. The metal foil pattern 3 is not formed around the annular metal foil 9 over a certain width so that the insulating resin plate 2 is exposed. In this case D1=d+(0.2~2.0)mm is realized where D1 is the outside diameter of the annular metal foil 9 and d is the inside diameter of the through hole 7. Preferably, the relationship should be D1=d+(0.5~1.0)mm. For example, when d is 1.3 mm, D1 is 1.5 mm or larger, not exceeding 3.3 mm, preferably ranging from 1.8 to 2.3 mm.

A few via holes 10 are drilled through from the front surface to the back surface of the printed circuit board 1 around the through hole 7. While the via holes 10 should be large enough to allow molten solder to flowed in smoothly for efficient heat conduction, they should preferably be as small as possible in the range where they can be formed by drilling for wider component mounting space. Therefore, the via holes 10 have a diameter of about 0.2 to 0.6 mm. These via holes 10 are all located within the range of a radius that substantially corresponds to the moving distance of the printed circuit board 1 in one second from the center of the through hole 7 during the dip soldering operation. For example, the via holes 10 are located within the distance of 1.6 cm from the center of the through hole 7, if the printed circuit board 1 is to be moved at a rate of 1 meter per minute during the dip soldering operation. The via holes 10 are connected to the tubular metal foil 8 inside the through hole 7 through one or more of the metal foil patterns 3 (L2 to L6) apart from the one on the front surface. The above mentioned area on the front surface of the printed circuit board 1 where there is no metal foil pattern 3 around the through hole 7 is at least larger than this range in which the via holes 10 are positioned. At the top open end of each via hole 10 on the front surface is formed a metal foil ring 10a, which should preferably be as small as possible.

In the example shown in FIG. 1A and FIG. 1B, the second layer of the metal foil pattern 3 (L2) includes a connection pattern 13 that stretches over the region below the area where no pattern 3 is formed around the through hole 7 on the surface of the printed circuit board 1. The connection pattern 13 is connected to the metal foil pattern 3 (L1) on the surface via the conductive material 5 filled in the hole 4 drilled in the insulating resin plate 2 below the surface layer, so that the lead 6 is connected to the power supply terminal pattern or ground pattern, as would be when the tubular metal foil 8 is directly connected to the power supply terminal pattern or ground pattern. Such connection design is freely arrangeable.

In the example shown in FIG. 1A and FIG. 1B, the metal foil pattern 3 (L1) is not formed over a predetermined width so that the insulating resin plate 2 is exposed around the through hole 7. If the metal foil pattern 3 (L1) is covered by a resist 11 as shown in FIG. 2, then an uncovered portion 12 is formed around the through hole 7, D2=d+(0.2~2.0)mm is realized where D2 is the outside diameter of the uncovered portion 12 and d is the inside diameter of the through hole 7, as with the above described annular metal foil 9. Preferably, the relationship should be D2=d+(0.5~1.0)mm.

With the above configuration, when the printed circuit board 1 undergoes the dip soldering operation, with the component lead 6 being inserted in the through hole 7, the through hole 7 is efficiently heated from the surrounding area through the plurality of via holes 10 arranged inside a range of radius that corresponds to the moving distance of the board in one second from the center of the through hole 7. Therefore, the temperature of the solder that has flowed into the through hole 7 is kept high, with a small temperature difference. Also, because the area where the metal foil is exposed around the through hole 7 on the surface of the board 1, i.e., the annular metal foil 9 or uncovered portion 12 of the resist 11, is made small, heat dissipation from around the through hole 7 on the board is restricted. Therefore, the temperature difference in the solder that has flowed into the through hole 7 is kept small, and the temperature of the entire solder is kept high.

The small temperature difference in the solder and the overall high temperature particularly in the upper part of the solder in the through hole 7 enhance solder wicking up into the hole 7, and therefore a favorable fillet is formed between the periphery of the lead 6 and the annular metal foil 9 or the metal foil pattern 3 in the uncovered portion 12 of the resist 11 around the through hole 7. The high temperature of the solder also ensures high flowability, whereby no air remains entrapped in the solder. As a result, the solder joints of leads 6 in the through holes 7 have higher heat fatigue resistance.

Second Embodiment

Figure 3:
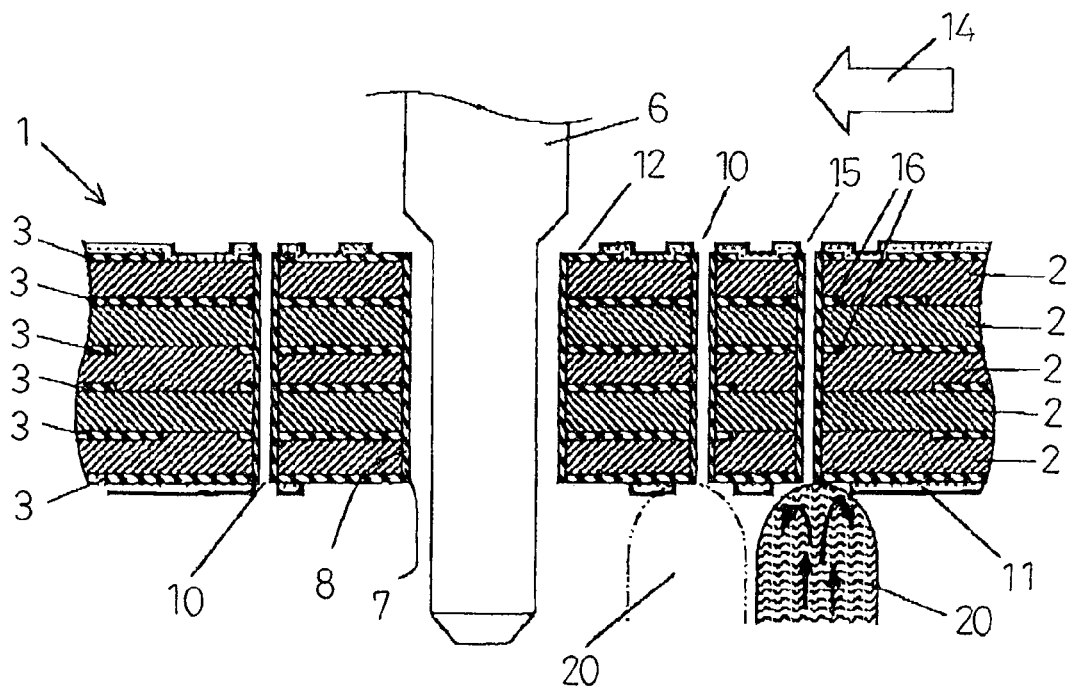
FIG. 3 is a detailed longitudinal cross-sectional view showing a relevant part of a printed circuit board according to a second embodiment of the present invention.

Next, a second embodiment will be described with reference to FIG. 3. Since many of the components are the same as those previously described, like components will have the same reference numerals and only the differences will be described.

In this embodiment, a via hole 15 is provided in addition to the via holes 10 on the side opposite from the direction of movement 14 of the board 1 indicated by the white arrow during the dip soldering operation. At least one or more upper layers of metal foil patterns 3 apart from the surface pattern, in the illustrated example the second and third layers of patterns L2 and L3, include connection patterns 16 to connect the via hole 15 with the tubular metal foil 8, so as to conduct heat of the solder to the through hole 7 through the via hole 15.

With this configuration, when the printed circuit board 1 undergoes the dip soldering operation in which it is moved above a dipping section 20 where molten solder is ejected upwards, the via hole 15 passes above the dipping section 20 after the through hole 7 and via holes 10, whereby the heat of the molten solder is conducted for a longer time at least to the upper part of the through hole 7 where the temperature easily drops. Therefore, the temperature difference inside the through hole 7 is kept small for a long time, and the solder joint of the lead 6 has higher heat fatigue resistance.

Third Embodiment

Figure 4:
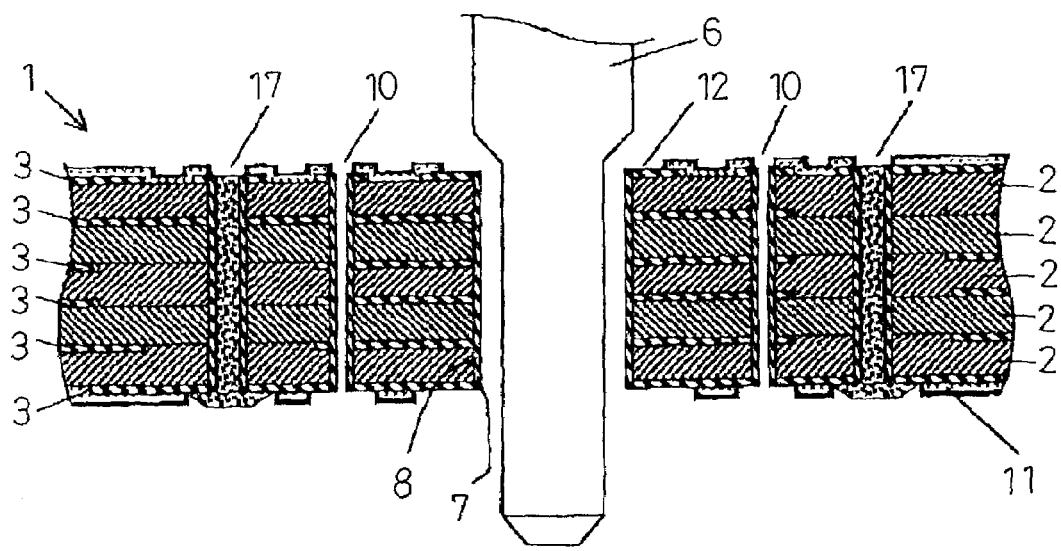
FIG. 4 is a detailed longitudinal cross-sectional view showing a relevant part of a printed circuit board according to a third embodiment of the present invention.

Next, a third embodiment will be described with reference to FIG. 4.

In this embodiment, the metal foil patterns 3 (L1 and L6) on the front surface and the back surface of the printed circuit board 1 are connected through via holes 17, on the outer side of the region where the insulating resin plate 2 is exposed around the through hole 7 on the surface of the board 1.

With this configuration, the high frequency impedance is lowered by connecting the metal foil patterns 3 (L1 and L6) on the front surface and the back surface by the solder filled in the via holes 17. This compensates for any decrease in the EMC effect caused by the absence of the metal foil pattern 3 (L1) over a relatively large area around the through hole 7 on the surface of the printed circuit board 1 and the lack of direct connection between the pattern 3 (L1) and the tubular metal foil 8 of the through hole 7.

Fourth Embodiment

Figure 5:
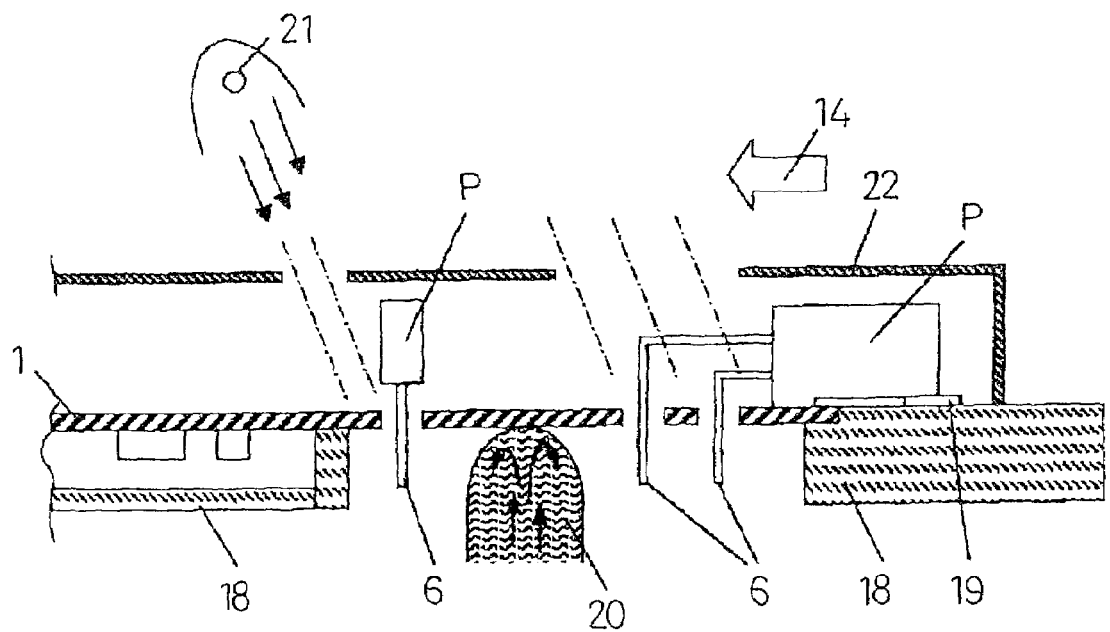
FIG. 5 is a longitudinal cross-sectional view showing a relevant part of a dip soldering apparatus according to a fourth embodiment of the present invention in a soldering process step.
Figure 6A:
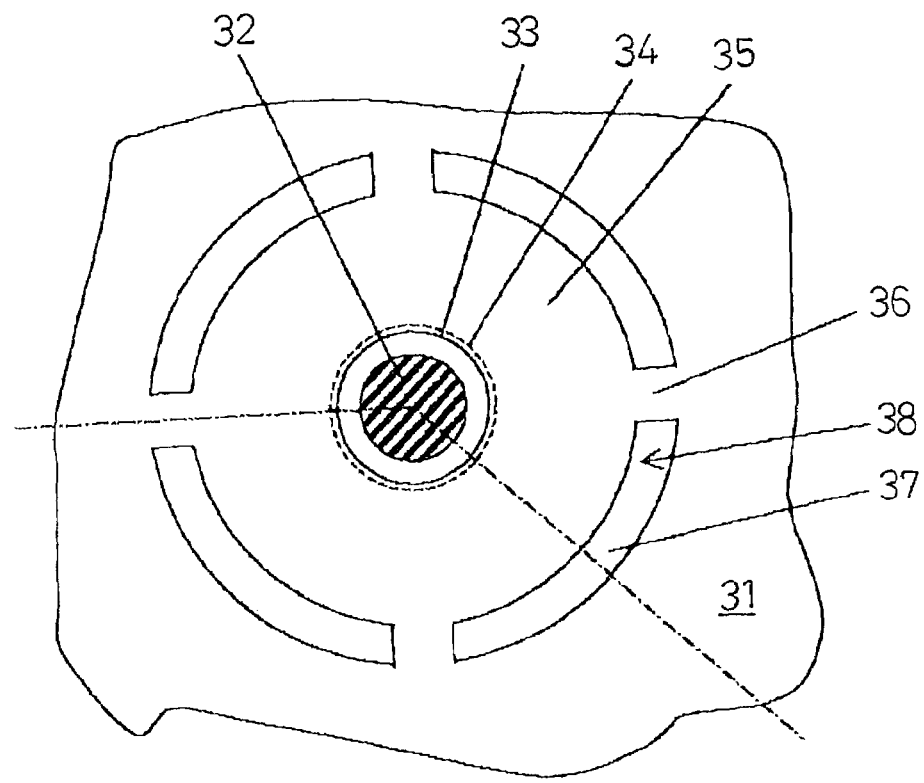
FIG. 6A and FIG. 6B show a relevant part of a conventional printed circuit board, FIG. 6A being a detailed plan view and FIG. 6B being a detailed longitudinal cross-sectional view.
Figure 6B:
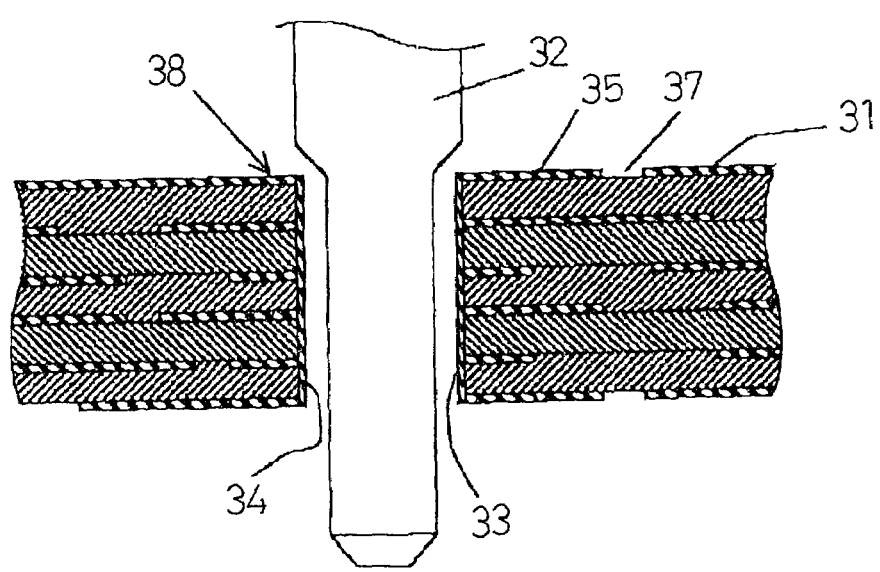

Next, a fourth embodiment of the invention, which is a dip soldering apparatus, will be described with reference to FIG. 5.

The apparatus includes a partial dipping jig 18 for holding the printed circuit board 1 with its dip soldered portion exposed on the underside. The partial dipping jig 18 is moved at a predetermined speed along the transfer path that passes above the dipping section 20. The jig 18 includes a support 19 for supporting the electronic component P having leads 6 such as a connector, so that the main part of the component P does not incline during the dip soldering operation.

Above the transfer path is provided heating means 21, which may be, but no limited to, a halogen lamp and a reflection mirror to radiate light energy or heat energy toward the dipping section 20 or its vicinity. The partial dipping jig 18 also includes a shield cover 22 to protect the main part of the component P on the printed circuit board 1 from the radiation heat from the heating means 21.

With this configuration, the surface of the printed circuit board 1 is heated from above at the dipping section 20 or in its vicinity. Therefore, heat dissipation from the surface of the printed circuit board 1 is restricted, and the temperature difference in the solder inside the through hole 7 is maintained small during the dip soldering operation, whereby the effects described above are reliably achieved and the solder joint of the lead 6 has higher heat fatigue resistance. Also, the shield cover 22 provided above the printed circuit board 1 protects the main part of the component P from the heat and prevents thermal damage of the component P.

While this embodiment has been described as an apparatus that transfers the printed circuit board in a horizontal direction, it goes without saying that the invention is applicable to an apparatus that holds and lowers the printed circuit board toward a jet of molten solder.

As described above, with the printed circuit board and soldering method and apparatus of the invention, the through hole is heated from around by molten solder flowing into via holes around the through hole, whereby the temperature of the solder inside the through hole is maintained high. Solder wicking is enhanced and a favorable fillet is formed between the periphery of the lead and surface copper foil. Also, the flowability of the solder is maintained high because of the high temperature, whereby air entrapment is prevented and the heat fatigue resistance of solder joints is improved. Thus the invention is effectively applicable to dip soldering operations of various printed circuit boards using lead free solder.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A printed circuit board comprising:
a first insulating plate having first and second surfaces, the first surface forming a front surface of the printed circuit board;
a first metal foil formed on the first surface of the first insulating plate;
a second insulating plate having third and fourth surfaces, the fourth surface forming a back surface of the printed circuit board;
a second metal foil formed on the fourth surface of the second insulating plate;
a third metal foil formed between the second surface of the first insulating plate and third surface of the second insulating plate;
a through hole formed through the first and second insulating plates, in which a lead is inserted and dip soldered using lead free solder, the through hole having a first tubular metal foil formed on a first inner surface of the through hole, and
a plurality of via holes formed through the first and second insulating plates around the through hole, each of the plurality of the via holes having a second tubular metal foil formed on a second inner surface of the corresponding via hole,
wherein the first metal foil includes an annular metal foil located around the through hole and spaced from the plurality of via holes by a predetermined distance, wherein the first metal foil has an annular area, located around the annular metal foil, exposing a part of the first surface of the first insulating plate, wherein the plurality of via holes are formed within the annular area,
wherein the first tubular metal foil of the through hole and the second tubular metal foil of each of the plurality of via holes are directly connected to both the second and third metal foils.

2. The printed circuit board according to claim 1, wherein:
D1=d+(0.2~2.0) mm, where D1 is an outside diameter of a metal foil on a surface around the through hole, and d is an inside diameter of the through hole.

3. The printed circuit board according to claim 1, wherein:
D2=d+(0.2~2.0) mm, where D2 is diameter of an uncovered portion of a resist covering on a metal foil on a surface around the through hole, and d is an inside diameter of the through hole.

4. The printed circuit board according to claim 1, wherein:
an additional via hole is provided on a side opposite from a moving direction of the printed circuit board during the dip soldering operation.

5. The printed circuit board according to claim 1, wherein:
another via hole is provided for connecting a surface of the printed circuit board and a metal foil of a given layer apart from the surface on an outer side of a region where an insulating resin plate is exposed and the via holes are provided around the through hole.

6. The printed circuit board according to claim 1, wherein each of the plurality of via holes comprises a metal foil ring disposed in the annular area.

* * * * *